(12) United States Patent
Badaroglu et al.

(10) Patent No.: US 11,121,075 B2
(45) Date of Patent: Sep. 14, 2021

(54) HYBRID METALLIZATION INTERCONNECTS FOR POWER DISTRIBUTION AND SIGNALING

(71) Applicant: QUALCOMM Incorporated, San Diego, CA (US)

(72) Inventors: Mustafa Badaroglu, Kessel-Lo (BE); Kern Rim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 169 days.

(21) Appl. No.: 15/933,581

(22) Filed: Mar. 23, 2018

(65) Prior Publication Data

US 2019/0295942 A1 Sep. 26, 2019

(51) Int. Cl.
| | |
|---|---|
| *H01L 23/522* | (2006.01) |
| *H01L 23/528* | (2006.01) |
| *H01L 23/50* | (2006.01) |
| *H01L 23/532* | (2006.01) |

(52) U.S. Cl.
CPC .......... *H01L 23/5226* (2013.01); *H01L 23/50* (2013.01); *H01L 23/528* (2013.01); *H01L 23/53228* (2013.01); *H01L 23/53257* (2013.01)

(58) Field of Classification Search
None
See application file for complete search history.

(56) References Cited

U.S. PATENT DOCUMENTS

| | | | | |
|---|---|---|---|---|
| 6,589,863 B1* | 7/2003 | Usami | ............... | H01L 21/76807 257/E21.579 |
| 9,530,737 B1* | 12/2016 | Fu | ........................ | H01L 21/7684 |
| 2007/0080461 A1* | 4/2007 | Lu | ..................... | H01L 21/76807 257/758 |
| 2011/0284991 A1* | 11/2011 | Hijioka | ................... | H01L 28/91 257/532 |
| 2012/0001344 A1* | 1/2012 | Takesako | .......... | H01L 21/31144 257/774 |
| 2018/0350665 A1* | 12/2018 | Chae | ................. | H01L 21/76816 |

* cited by examiner

*Primary Examiner* — Nicholas J Tobergte
*Assistant Examiner* — Kien C Ly
(74) *Attorney, Agent, or Firm* — Qualcomm Incorporated

(57) ABSTRACT

Aspects of the disclosure are directed to an integrated circuit. The integrated circuit may include a signaling interconnect having a narrow trench disposed within a metallization layer, and a power rail having a wide trench disposed within the metallization layer, wherein the signaling interconnect comprises non-copper material and the power rail comprises copper. The non-copper material may include at least one of ruthenium (Ru), tungsten (W), aluminum (Al), and cobalt (Co). The signaling interconnect and power rail may be processed in a common chemical mechanical polishing step and have approximately the same trench depth. A metal cap may be deposited on top of the power rail.

14 Claims, 5 Drawing Sheets

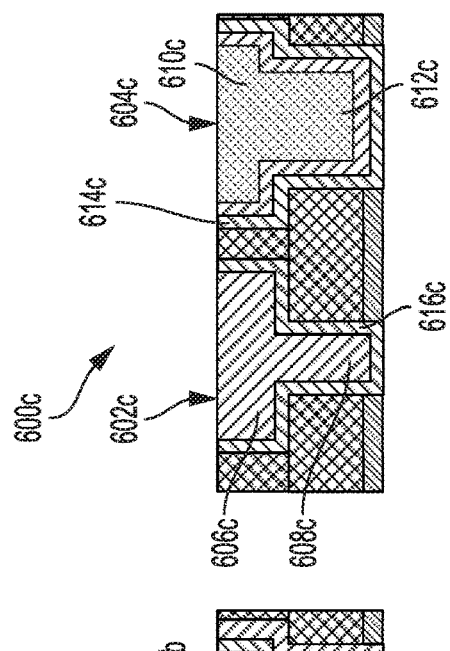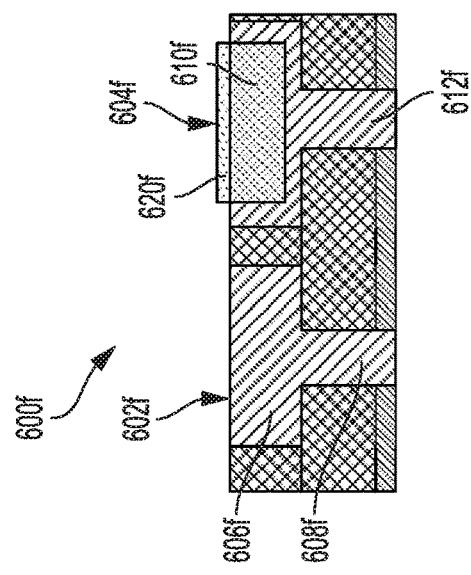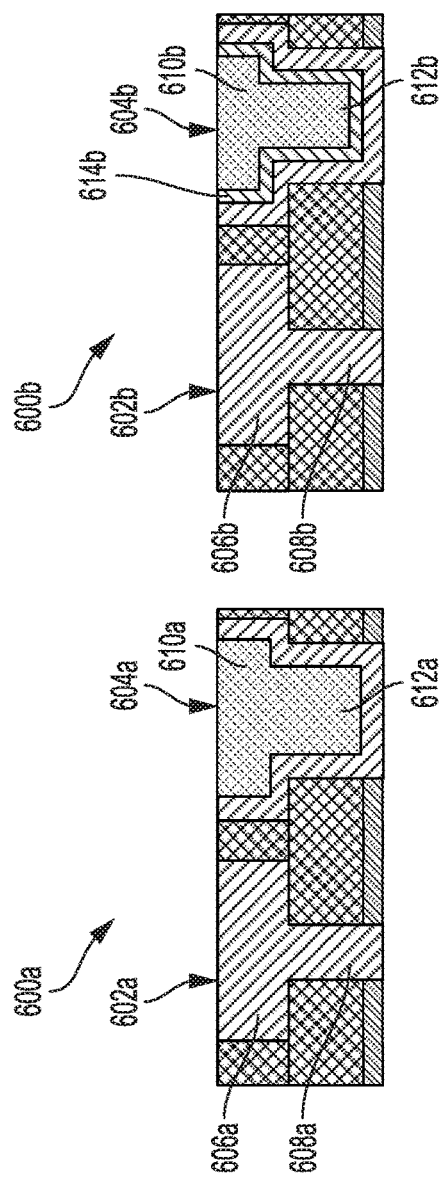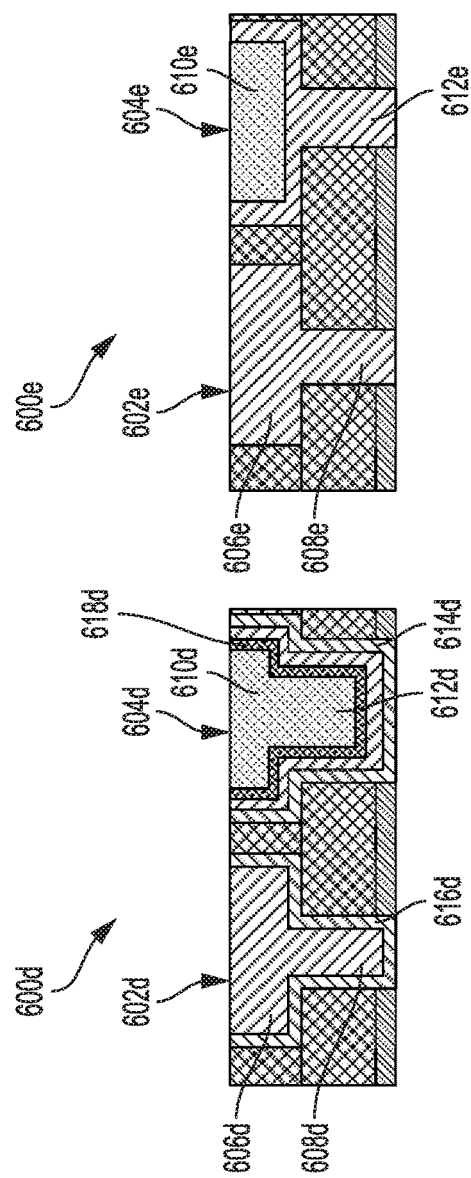

HYBRID METALLIZATION INTERCONNECTS FOR POWER DISTRIBUTION AND SIGNALING

BACKGROUND

Field

Aspects of the present disclosure relate generally to semiconductor structures and, more particularly, to semiconductor structures including hybrid metallization interconnects used for power distribution and signaling.

Background

Copper (Cu) is a commonly used material for metallization layers. Copper has high electrical conductivity providing for relatively low resistance and good integrated chip performance. Copper metallization layers (e.g., metal wires and vias) are often formed using a damascene process in which copper is deposited into a patterned dielectric material. For example, in a dual damascene process a dielectric material is deposited over a semiconductor substrate. The dielectric material is etched to form openings for a via (e.g., through a via hole) and a metal wire (e.g., through a metal trench). The openings are then filled with copper and a planarization process is performed to remove excess copper from the substrate.

At smaller nodes such as 7 nm and below, the size of integrated chip components and metallization layers decreases. In particular, technology scaling increases the resistance of interconnects including metal wires and vias used for power distribution and signaling, which affect product performance and functional yield. For example, the dimensions of metal wires and vias become smaller making it increasingly difficult for damascene processes to fill metal trenches and/or via holes with copper. In addition, interface scattering is increased because of increased interface to volume ratio. These drawbacks result in high electrical resistance in a metallization layer and may lead to electrical opens or voids. Wider rail (e.g., power rail) interconnects used for power distribution still require larger trench widths at advanced process nodes and may still use copper. Signaling interconnects, however, have very small widths (typically implemented in critical dimensions (CDs), e.g., 7 nm and below) at advanced process nodes that require use of alternative metals with superior filling capability, thin adhesion layer, and moderate resistivity. Accordingly, there is a need for semiconductor structures with hybrid metallization interconnects combining both copper and non-copper materials for power distribution and signaling, especially at smaller nodes such as 7 nm and below.

SUMMARY

The following presents a simplified summary of one or more embodiments to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

One described embodiment comprises a method of forming a metallization layer. The method may include selectively etching an interlayer dielectric (ILD) layer to form a narrow trench and a wide trench, partially filling the wide trench with a non-copper material by conformal metallization, completely filling the narrow trench with the non-copper material by conformal metallization, filling the wide trench with copper after conformal metallization, and removing excess from the narrow trench forming a signaling interconnect, and removing excess from the wide trench forming a power rail. The method may further comprise depositing a metal cap on the power rail.

Another described embodiment describes an integrated circuit. The integrated circuit may include a signaling interconnect having a narrow trench disposed within a metallization layer, and a power rail having a wide trench disposed within the metallization layer, wherein the signaling interconnect comprises non-copper material and the power rail comprises copper. The non-copper material may include at least one of ruthenium (Ru), tungsten (W), aluminum (Al), and cobalt (Co). The signaling interconnect and power rail may be processed in a common chemical mechanical polishing step and have approximately the same trench depth. A metal cap may be deposited on top of the power rail.

These and other embodiments of the invention will become more fully understood upon a review of the detailed description, which follows. Other embodiments of the invention will become apparent to those of ordinary skill in the art, upon reviewing the following description of specific, exemplary embodiments of the invention in conjunction with the accompanying figures.

BRIEF DESCRIPTION OF THE DRAWINGS

FIGS. 6A-6F illustrate semiconductor structures including hybrid metallization interconnects in accordance to additional embodiments of the invention.

DETAILED DESCRIPTION

The detailed description set forth below, in connection with the appended drawings, is intended as a description of exemplary embodiments and is not intended to represent the only embodiments in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
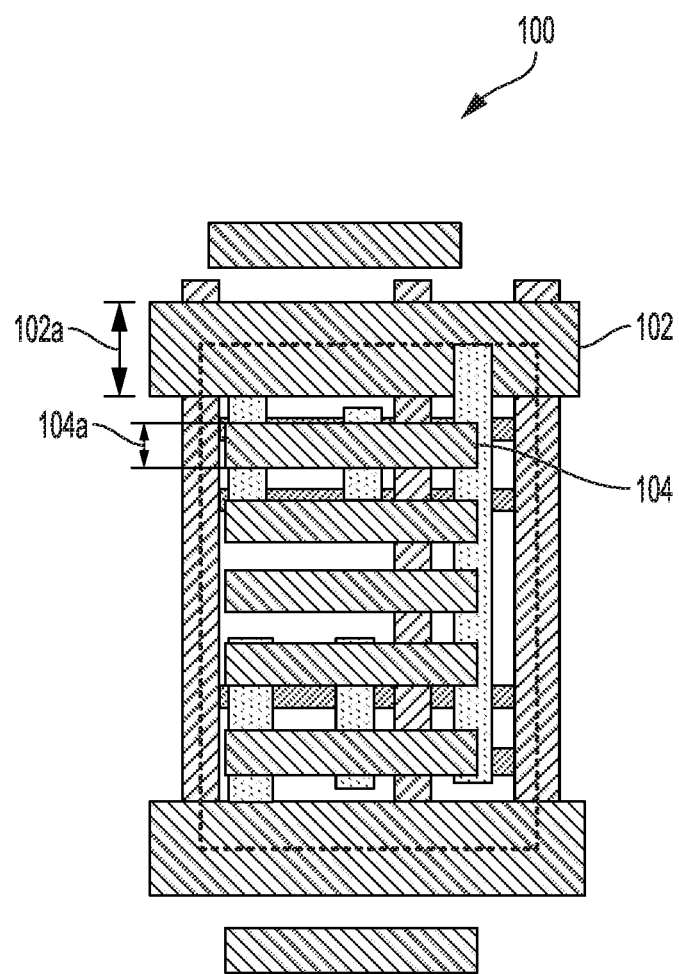
FIG. 1 is a top view of semiconductor structures including power and signaling lines of the prior art.

FIG. 1 is a top view of semiconductor structures 100, including power and signaling lines, in accordance with the prior art. The semiconductor structures 100 include power rail interconnect 102 and signaling interconnect 104. The power rail interconnect 102 has a wide trench width 102*a* to meet voltage drop electro-mechanical (EM) requirements. The wide trench width 102*a* is approximately 24-48 nm. The signaling interconnect 104 has narrow trench width 104a for better routing in a smaller area. The narrow trench width 104a is approximately 8-14 nm. Both the power rail interconnect 102 and signaling interconnect 104 comprise of copper (Cu) and are formed in a dual damascene process. Copper has performed well in larger process nodes such as 10 nm and above but at smaller process nodes starting with 7 nm and below, resistance increases exponentially when scaling down and performance degrades. At smaller nodes, the power rail interconnect 102 may still have a trench width 102a wide enough to permit the use of copper. However, the signaling interconnect 104 critical dimensions (CDs) are too small and too resistive at smaller nodes such as 7 nm and below to use copper. That is, the narrow trench width 104a is too narrow at smaller nodes such as 7 nm and below.

In addition, when deposited by chemical vapor deposition (CVD), the copper volume portion in a conductor does not scale for smaller nodes as dimensions of the metal wires and vias become smaller as compared to current process nodes. One known solution is to add repeaters but this becomes an endless problem by increasing area (5%-10%) and imposing a power penalty. Furthermore, there is also yield risk if copper metallization is used in narrower lines due to voiding. One remedy is to use non-copper metallization for both the signaling and power rails. But the voltage drop in the power rails would be adversely impacted. Accordingly, there is a need for semiconductor structures including hybrid metallization interconnects combining both copper and non-copper materials for power distribution and signaling at smaller process nodes such as 7 nm and below.

Figure 2A:
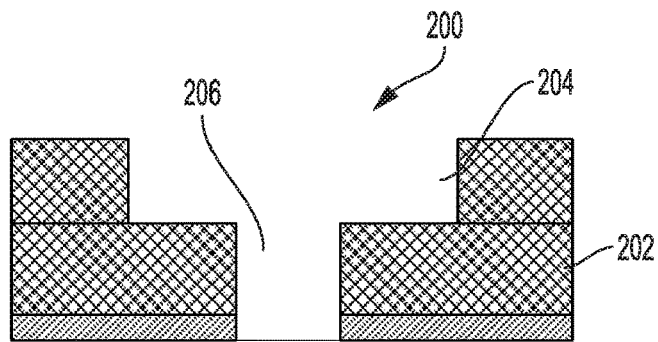
FIGS. 2A-2D illustrate a method of forming power and signaling lines in accordance to the prior art.
Figure 2B:
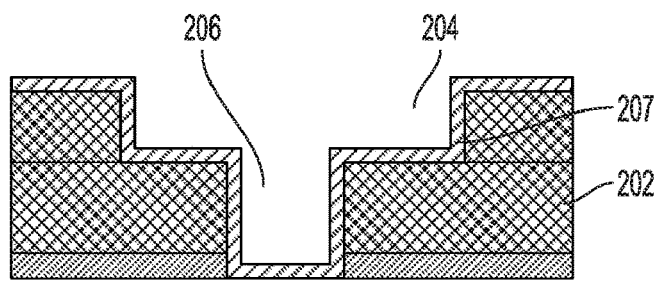
Figure 2C:
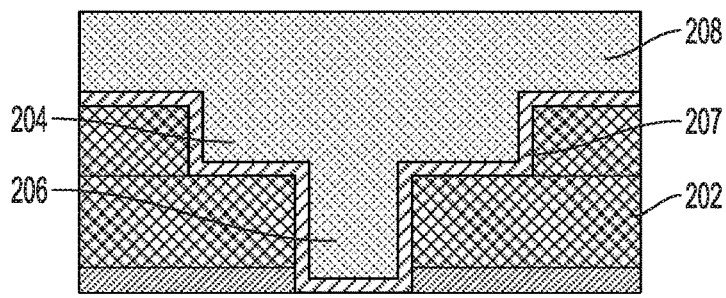
Figure 2D:
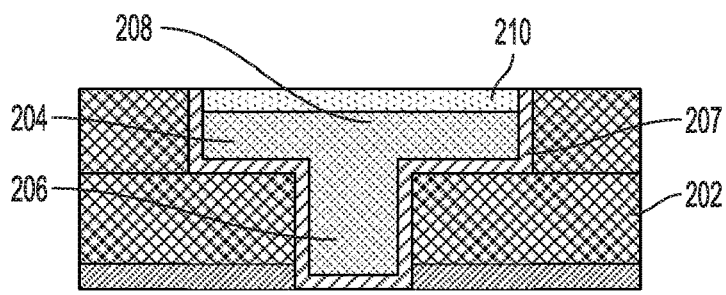

FIGS. 2A-2D illustrate a method of forming semiconductor structures 200, including power and signaling lines, in accordance with the prior art. FIG. 2A illustrates an interlayer dielectric (ILD) layer 202 of the interconnect structures 200 that are etched to form a trench 204 and a via 206 within the ILD layer 202. The ILD 202 layer is a low-k dielectric layer having a dielectric constant (k value) less than about 4.0. For example, the ILD layer 202 is exposed to an etchant to etch the ILD layer 202 according to a masking layer to form the trench 204 and the via 206. In FIG. 2B, a barrier layer, a liner, and a seed layer (shown together as 207 in FIG. 2B) are deposited on top surfaces of the ILD layer 202, trench 204, and via 206 by chemical vapor deposition (CVD). The barrier layer is approximately 1.5 nm thick and comprises tantalum nitride (TaN). The liner is approximately 1 nm thick and comprises cobalt (Co) or ruthenium (Ru). The seed layer is approximately 3 nm thick and comprises copper (Cu). Next, in FIG. 2C, the trench 204 and via 206 are filled with a metal 208 such as copper. In FIG. 2D, a chemical mechanical polishing (CMP) process is performed to planarize and remove excess, e.g., from the top of trench 204 and via 206. Because the barrier layer, liner, and seed layer 207 are not sufficiently conductive, the trench 204 and via 206 need to be completely filled with copper to reduce the overall resistance of the semiconductor structures 200. The barrier and liner are formed to avoid electromigration (EM) and time-dependent-di-electric (TDDB) failures. The seed layer is formed to allow a robust copper fill following the seed layer. An optional metal cap 210 comprising cobalt is deposited on top of the metal 208. The optional metal cap 210 improves EM. The method as illustrated in FIGS. 2A-2D is performed according to a damascene process.

Figure 3:
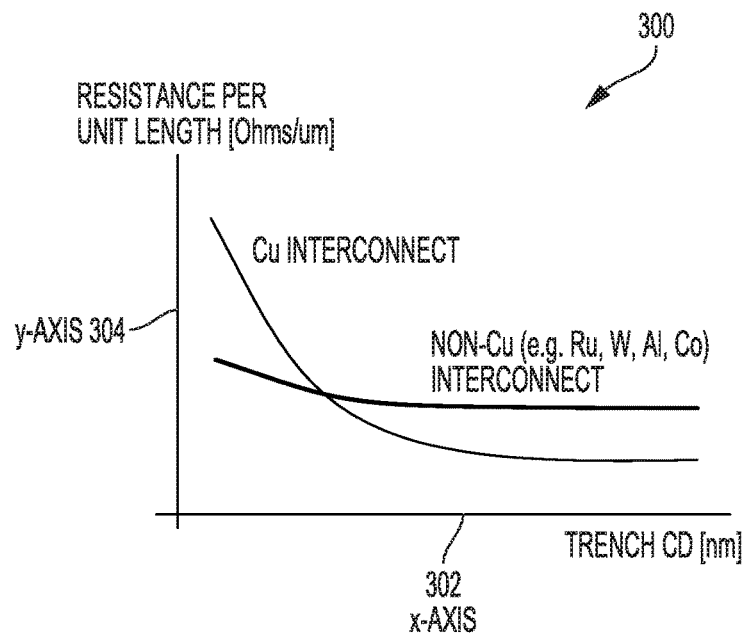
FIG. 3 is a chart illustrating the use of semiconductor structures including hybrid metallization interconnects.

FIG. 3 is a chart 300 illustrating benefit use of semiconductor structures including hybrid metallization interconnects combining both copper and non-copper materials for smaller nodes such as 7 nm and below. In particular, chart 300 illustrates "Trench critical dimension (CD) (nm)" in the x-axis 302 and "Resistance per unit length" in the y-axis 304 for copper interconnect and non-copper interconnects including, e.g., ruthenium (Ru), tungsten (W), aluminum (Al), and cobalt (Co). As illustrated at the left side of the chart, at lower trench critical dimension (CD) such as 7 nm and below, it is preferable to use non-copper interconnects because as CD scales down resistance increases exponentially for copper resulting in performance degradation (i.e., copper resistance increases exponentially at the left side of the x-axis). In contrast, at higher trench critical dimension such as 10 nm and above (i.e., at the right side of the chart), it is preferable to use copper interconnect since copper provides better resistance, and copper is known to provide high electrical conductivity (i.e., low resistance) at wider trenches. As such, there is a need for semiconductor structures including hybrid metallization interconnects combining both copper and non-copper materials for power distribution and signaling at smaller process nodes such as 7 nm and below.

Figure 4:
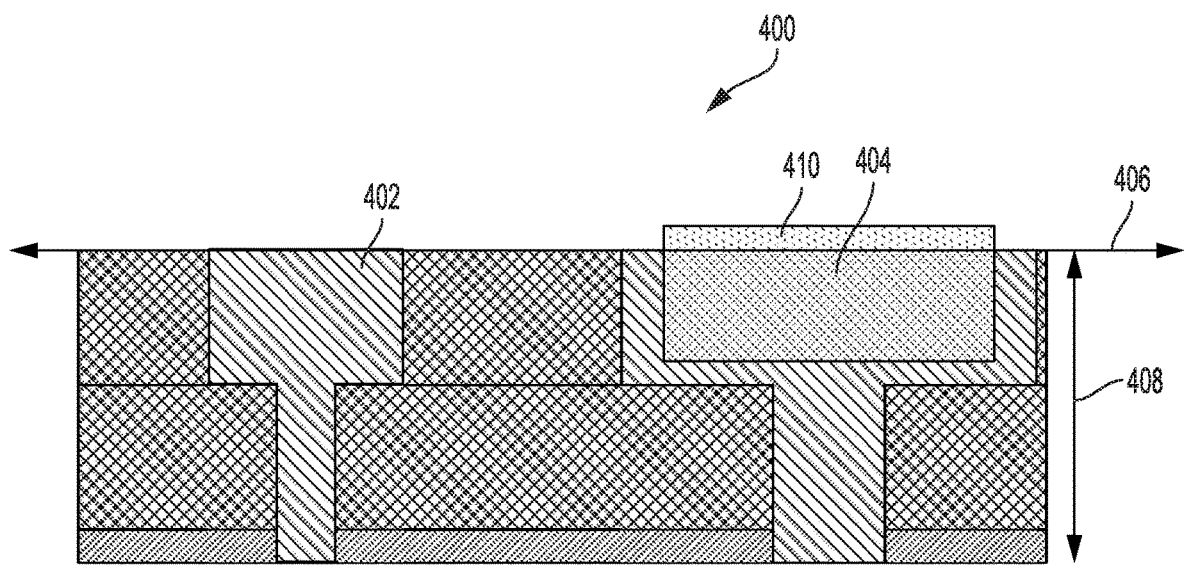
FIG. 4 is a cross-section view of semiconductor structures including hybrid metallization interconnects in accordance to an embodiment of the invention.

FIG. 4 illustrates a cross-section view of semiconductor structures including hybrid metallization interconnects 400 in accordance to an embodiment of the invention. The hybrid metallization interconnects 400 of the invention may include a signaling interconnect 402 and a wider rail, e.g., power rail 404. The hybrid metallization interconnects 400 may be formed by depositing or filling the signaling interconnect 402 with a non-copper material and depositing or filling the power rail 404 with copper as further described in the process of FIGS. 5A-5D. The signaling interconnect 402 may have narrow lines and the power rail 404 may have wide lines. For example, the signaling interconnect 402 may have a narrow trench having a width of approximately 8-12 nm, and the power rail 404 may have a wide trench having a width of approximately 24-48 nm. Because the power rail 404 may still have a wide enough trench width at smaller nodes such as 7 nm and below, the power rail 404 may still be filled with copper. However, the narrow trench width of the signaling interconnect 402 is too narrow at smaller nodes such as 7 nm and below resulting in performance degradation and, thus, another material other than copper need to be used for the narrow trench of the signal interconnect 402. The non-copper materials that may be used for the narrow trench of the signaling interconnect 402 include at least one of ruthenium (Rd), tungsten (W) aluminum (Al), and cobalt (Co).

Both the signaling interconnect 402 and the power rail 404 may be processed using common chemical mechanical polishing (CMP) process as evidenced by a common plane 406. The common plane 406 may be critical, i.e., having both the signaling interconnect 402 and power rail 404 processed in one common CMP process step, to having a robust connection to/from the next metallization layer above without any open or void. Furthermore, reducing processing of the signaling interconnect 402 and power rail 404 to a single CMP step reduces process cost since CMP is typically one of the more expensive steps in the metallization process. In addition, both the signaling interconnect 402 and power rail 404 may have the same trench depth 408. In other words, the trench depth 408 may be formed by a common etch step in a low k dielectric layer. That is, the invention provides for a single etch in a single metallization layer for both the signaling interconnect 402 comprising on non-copper materials and the power rail 404 comprising of copper. This results in a cost reduction solution integrating two metal schemes at the same time.

The signaling interconnect 402 may have a single CD. An optional metal cap 410 may be deposited on top of the copper filled power rail 404. The metal cap 410 may comprise of cobalt (Co). Cobalt may be selectively deposited on the copper to improve EM. The metal cap 410 may be a thin cap having dimension of approximately 1×CD across the trench and continuous along the trench and a cap height of approximately 2-10 nm.

Figure 5A:
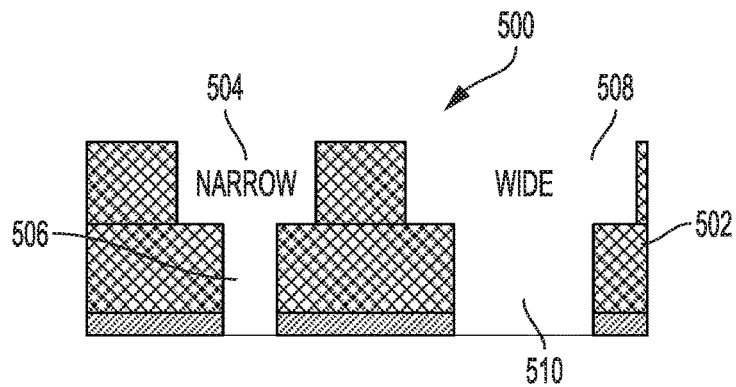
FIGS. 5A-5D illustrate a method of forming semiconductor structures including hybrid metallization interconnects in accordance to an embodiment of the invention.
Figure 5B:
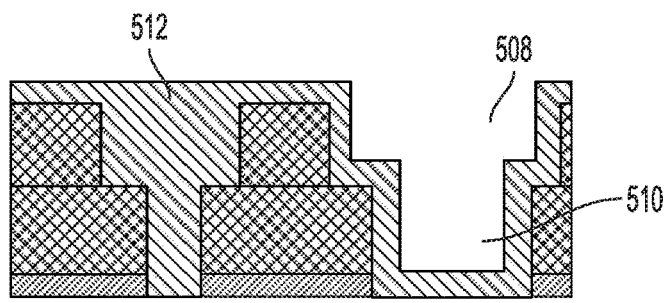
Figure 5C:
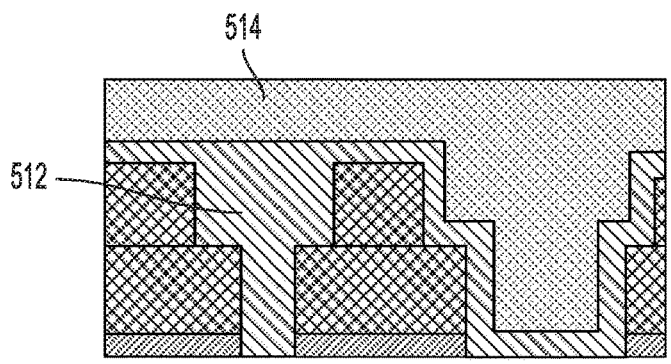

FIGS. 5A-5D illustrate a method 500 of forming semiconductor structures including hybrid metallization interconnects combining copper and non-copper materials in accordance to an embodiment of the invention. While method 500 is illustrated and described as a series of steps, the ordering of such steps are not to be limited to such order. For example, some steps may occur in different orders and/or concurrently with other steps apart from those illustrated and described herein. In FIG. 5A, there is shown an interlayer dielectric (ILD) layer 502 that may be selectively (by first patterning) etched to form a narrow trench 504, a narrow via 506 formed below the narrow trench 504, a wide trench 508, and a wide via 510 formed below the wide trench 508. The ILD layer 502 is preferably a low-k dielectric layer having a dielectric constant (k value) less than about 4.0, for example, may be $SiO_2$. The ILD layer 502 may be exposed to an etchant that is configured to selectively etch the ILD layer 502 according to a masking layer to form the narrow trench 504, wide trench 508, narrow via 506, and wide via 510, The masking layer may comprise a photoresist layer. The etchant may comprise a plasma etchant having an etching chemistry comprising one or more of tetrafluoromethane ($CF_4$) or octafluorocyclobutane ($C_4F_8$). The narrow trench 504 may have a width of approximately 8-12 nm, the wide trench 508 may have a width of approximately 24-48 nm, the narrow via 506 may have a width of approximately 8-12 nm, and the wide via 510 may have a width of approximately 24-48 nm.

In FIG. 513, the narrow trench 504, wide trench 508, narrow via 506, and wide via 510 may be filled with a non-copper material 512 by conformal metallization such as Co, Ru, Al, or W. This is also known as conformal fill metal deposition. The conformal metallization process partially fills the wide trench 508 and wide via 510 along the sidewalls and at the bottom of the wide trench 508 and via 510. The conformal metallization process completely fills the narrow trench 504 and narrow via 506 with metal composition. For the wide trench 508 and wide via 510, it is important to have the middle of the trenches and vias not completely filled for copper filling later. After conformal metallization, the narrow trench 504, wide trench 508, narrow via 506, and wide via 510 are filled with copper in FIG. 3C. In particular, the narrow trench 504, wide trench 508, narrow via 506, and wide via 510 are overburdened (i.e., completely filled to the top) with copper 514. The narrow trench 504, wide trench 508, narrow via 506, and wide via 510 are then polished by an electrical mechanical polishing process for planarization.

Figure 5D:
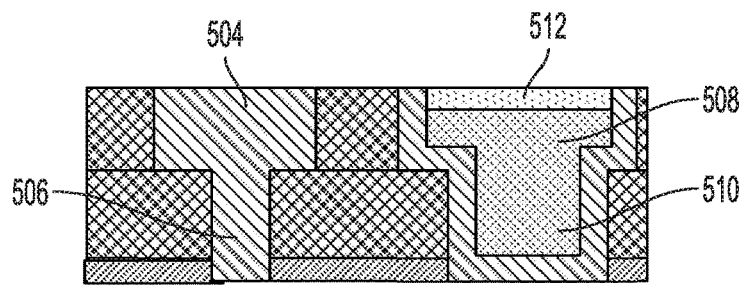

In FIG. 5D, a chemical mechanical polishing (CMP) process may be performed to planarize and remove excess from the narrow trench 504, wide trench 508, narrow via 506, and wide via 510. The CMP process planarizes the layer with a single-step CMP to remove the metal fill overburden and this leaves the copper and non-copper lines at the same layer or level, e.g., metal layer 1. An optional metal cap 512 may be deposited on top of the copper filled trench 508. The metal cap 512 may comprise of cobalt (Co). Cobalt may be selectively deposited on the copper to improve EM. The metal cap 512 may be a thin cap having dimension of approximately 2×CD and a cap height of approximately 2-10 nm. It is appreciated that most of the volume of the wide trench 508 is occupied by copper for lowering the resistance of the power rail.

FIGS. 6A-6F illustrate semiconductor structures including hybrid metallization interconnects combining copper and non-copper materials in accordance to additional embodiments of the invention. In one embodiment, FIG. 6A illustrates semiconductor structures including hybrid metallization interconnects 600a combining copper and non-copper materials including a signaling interconnect 602a and a power rail 604a. The hybrid metal interconnects 600a may include a narrow trench 606a, a narrow via 608a formed below the narrow trench 606a, a wide trench 610a, and a wide via 612a formed below the wide trench 610a. In this embodiment, the hybrid metal interconnect 600a does not include an optional metal cap deposited on copper filled power rail 604a as illustrated in FIG. 4, In another embodiment, FIG. 6B illustrates semiconductor structures including hybrid metallization interconnects 600b combining copper and non-copper materials including a signaling interconnect 602b and a power rail 604b. The hybrid metal interconnects 600b may include a narrow trench 606b, a narrow via 608b formed below the narrow trench 606b, a wide trench 610b, and a wide via 612b formed below the wide trench 610b. In this embodiment, a barrier layer 614b of approximately 1 nm is formed in the wide trench 610b and wide via 612b to protect the copper filling. The barrier layer 614b may comprise of titanium nitride (TiN), tantalum (Ta), or tantalum nitride (TaN). In another embodiment, FIG. 6C illustrates semiconductor structures including hybrid metallization interconnects 600c combining copper and non-copper materials including a signaling interconnect 602c and a power rail 604c. The hybrid metal interconnects 600c may include a narrow trench 606c, a narrow via 608c formed below the narrow trench 606c, a wide trench 610c, and a wide via 612c formed below the wide trench 610c. In this embodiment, a barrier layer 614c and 616c are formed in both the wide rails (i.e., wide trench 610c and wide via 612c), and narrow lines (i.e., narrow trench 606c and narrow via 608c), respectively, to protect the copper filling. For narrow lines (i.e., narrow trench 606c and narrow via 608c), the barrier layer 616c is very thin and is approximately 0.5 nm to 1 nm; for the wide rails (i.e., wide trench 610c and wide via 612c), the barrier layer 616c is approximately 1 nm. In another embodiment, FIG. 6D illustrates semiconductor structures including hybrid metallization interconnects 600d combining copper and non-copper materials including a signaling interconnect 602d and a power rail 604d. The hybrid metal interconnects 600d may include a narrow trench 606d, a narrow via 608d formed below the narrow trench 606d, a wide trench 610d, and a wide via 612d formed below the wide trench 610d. This embodiment is similar to that of the hybrid interconnects 600c with the addition of seed layer 618d. The seed layer is approximately 3 nm. In another embodiment, FIG. 6E illustrated semiconductor structures including hybrid metallization interconnects 600e combining copper and non-copper materials hybrid metal interconnect structures 600e including a signaling interconnect 602e and a power rail 604e. The hybrid metal interconnects 600e may include a narrow trench 606e, a narrow via 608e formed below the narrow trench 606e, a wide trench 610e, and a narrow via 612e formed below the wide trench 610d. This embodiment is similar to that shown in FIG. 6A with the exception that via 612e for the wide rails (i.e., wide trench 610e) is narrow. This results in the narrow via 612e being completely filled with non-copper metallization during deposition. In another embodiment, FIG. 6F illustrates semiconductor structures including hybrid metallization interconnects 600f combining copper and non-copper materials a hybrid metal interconnect structures 600f similar to the hybrid metal interconnect structures 600e as shown in FIG. 6E. In addition, the metal interconnects 600f further includes a metal cap 620f deposited on copper filled power rail 610f.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. An integrated circuit, comprising:
   a signaling interconnect having a narrow trench; and
   a power rail having a wide trench;
   a first via formed below the narrow trench, and a second via formed below the wide trench,
   wherein the signaling interconnect comprises non-copper material and the power rail comprises copper,
   wherein the signaling interconnect and the power rail have a common plane processed in a single common chemical mechanical polishing step, and
   wherein the first via has a width of approximately 8 to 12 nm, and the second via has a width of approximately 24 to 48 nm.

2. The integrated circuit of claim 1, wherein the narrow trench has a width of approximately 8 to 12 nm.

3. The integrated circuit of claim 1, wherein the wide trench has a width of approximately 24 to 48 nm.

4. The integrated circuit of claim 1, wherein the non-copper material includes at least one of ruthenium (Ru), tungsten (W), aluminum (Al), and cobalt (Co).

5. The integrated circuit of claim 1, wherein the narrow trench and the wide trench have approximately the same trench depth.

6. The integrated circuit of claim 1, further comprising a metal cap deposited on top of the power rail.

7. The integrated circuit of claim 6, wherein the metal cap comprises of cobalt (Co) and has a cap height of approximately 2 to 10 nm.

8. The integrated circuit of claim 1, further comprising a barrier seed layer formed in the wide trench and the second via.

9. The integrated circuit of claim 8, wherein the barrier seed layer is approximately 1 nm thick.

10. The integrated circuit of claim 8, wherein the barrier seed layer comprises titanium nitride (TiN), tantalum (Ta), or tantalum nitride (TaN).

11. The integrated circuit of claim 1, further comprising a barrier layer formed in the wide trench, the second via, the narrow trench, and the first via.

12. The integrated circuit of claim 11, wherein the barrier layer for the narrow trench and the first via is approximately 0.5 nm to 1 nm.

13. The integrated circuit of claim 11, wherein the barrier layer for the wide trench and the second via is approximately 1 nm.

14. The integrated circuit of claim 1, wherein the first via is completely filled with a non-copper metallization during deposition.

* * * * *